US009246329B2

(12) United States Patent
Duan et al.

(10) Patent No.: US 9,246,329 B2
(45) Date of Patent: Jan. 26, 2016

(54) ELECTROSTATIC DISCHARGE PROTECTION CIRCUIT AND DISPLAY DEVICE INCLUDING THE SAME

(71) Applicant: BOE TECHNOLOGY GROUP CO., LTD., Beijing (CN)

(72) Inventors: Liye Duan, Beijing (CN); Zhongyuan Wu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/127,767

(22) PCT Filed: Nov. 29, 2012

(86) PCT No.: PCT/CN2012/085559
§ 371 (c)(1),
(2) Date: Dec. 19, 2013

(87) PCT Pub. No.: WO2013/104218
PCT Pub. Date: Jul. 18, 2013

(65) Prior Publication Data
US 2014/0126094 A1    May 8, 2014

(30) Foreign Application Priority Data
Jan. 12, 2012   (CN) .......................... 2012 1 0008979

(51) Int. Cl.
*H02H 9/00*   (2006.01)
*H02H 9/04*   (2006.01)
(Continued)

(52) U.S. Cl.
CPC ................ *H02H 9/045* (2013.01); *G09G 5/00* (2013.01); *H01L 27/0296* (2013.01)

(58) Field of Classification Search
CPC ...... H02H 9/045; H02H 9/04; H01L 27/0296; G09G 5/00
USPC .......................................................... 361/56
See application file for complete search history.

(56) References Cited

U.S. PATENT DOCUMENTS

| 5,701,024 A | 12/1997 | Watt |
| 5,798,534 A * | 8/1998 | Young .............................. 257/59 |
| 6,442,079 B2 * | 8/2002 | Lee .......................... G11C 16/30 365/189.09 |

(Continued)

FOREIGN PATENT DOCUMENTS

| CN | 1848435 A | 10/2006 |
| CN | 101657900 A | 2/2010 |

(Continued)

OTHER PUBLICATIONS

International Search Report mailed Mar. 7, 2013; PCT/CN2012/085559.

(Continued)

*Primary Examiner* — Thienvu Tran
*Assistant Examiner* — Lucy Thomas
(74) *Attorney, Agent, or Firm* — Ladas & Parry LLP

(57) ABSTRACT

An electrostatic discharge (ESD) protection circuit and a display device comprising the protection circuit are provided. The protection circuit comprises a first depletion mode thin-film transistor, a second depletion mode thin-film transistor, a third depletion mode thin-film transistor, and a voltage dividing unit. This, when in normal operation, effectively prevents a signal line from releasing a large amounts of current, ensures that an internal array of the display device operates normally, and when an ESD occurs, allows for rapid discharge of an electrostatic charge accumulated on the signal line and ensures that the internal array of the display device is free from the electrostatic damage. Hence, application of the ESD protection circuit allows for utilization of low-cost depletion mode thin-film transistors to implement of electrostatic discharge and for reduced the manufacturing cost of the ESD protection circuit, thus reducing the manufacturing costs of the display device comprising the protection circuit.

15 Claims, 4 Drawing Sheets

(51) Int. Cl.
*G09G 5/00* (2006.01)
*H01L 27/02* (2006.01)

(56) References Cited

U.S. PATENT DOCUMENTS

| | | | |
|---|---|---|---|
| 7,379,127 B2 * | 5/2008 | Tsao | 349/40 |
| 2006/0145951 A1 * | 7/2006 | Watanabe et al. | 345/55 |
| 2006/0181823 A1 * | 8/2006 | Miller et al. | 361/56 |
| 2006/0227126 A1 | 10/2006 | Kawagoshi | |
| 2006/0274466 A1 | 12/2006 | Rice | |

FOREIGN PATENT DOCUMENTS

| | | |
|---|---|---|
| CN | 101707196 A | 5/2010 |
| CN | 101859764 A | 10/2010 |
| CN | 102315633 A | 1/2012 |
| CN | 102651547 A | 8/2012 |
| CN | 102655145 A | 9/2012 |

OTHER PUBLICATIONS

First Chinese Office Action dated Dec. 5, 2012; Appln. No. 201210008979.8.

Second Chinese Office Action dated Feb. 17, 2013; Appln. No. 201210008979.8.

International Preliminary Report on Patentability dated Jul. 15, 2014; PCT/CN2012/085559.

* cited by examiner

ELECTROSTATIC DISCHARGE PROTECTION CIRCUIT AND DISPLAY DEVICE INCLUDING THE SAME

TECHNICAL FIELD OF THE DISCLOSURE

The present disclosure relates to a technical field of display, and particularly to an electrostatic discharge protection circuit and a display device including the same.

BACKGROUND

An ESD (Electro-Static Discharge) protection circuit is an important component part of a display device, and can ensure the display device from electrostatic damage in producing, transporting, and operating procedures. FIG. 1 shows a schematic diagram of a structure of an array inside the display device and an ESD protection circuit surrounding the array in the prior art. Referring to FIG. 1, in normal operation, there is only a small leakage current flowing from a data (Vdata) line 11 or a gate (Vgate) line 12 to a gate high level (VGH) line 14 and a gate low level (VGL) line 15; when ESD occurs, positive charges of the Vdata line 11 or the Vgate line 12 may be released quickly to the VGH line 14 through the ESD protection circuit 13 and negative charges of the Vdata line 11 or the Vgate line 12 may be released quickly to the VGL line 15 through the ESD protection circuit 13, wherein levels of the VGH line 14 and the VGL line 15 are a high level and a low level of a gate scanning signal, respectively.

FIG. 2 shows a schematic diagram of a structure of an ESD protection circuit in the prior art. As shown in FIG. 2, the ESD protection circuit 13 as shown in FIG. 1 comprises two enhanced P-type thin-film transistors (TFTs) M1 and M2, descriptions will be given by taking the Vdata line 11 as an example. A thin-film transistor M1 has a gate connected to the Vdata line 11, a source connected to the Vdata line 11, and a drain connected to the VGH line 14; and a thin-film transistor M2 has a gate connected to the VGL line 15, a source connected to the VGL line 15, and a drain connected to the Vdata line 11. In normal operation. At this time, a level of the Vdata line 11 is between the level of the VGH line 14 and the level of the VGL line 15, there is no forward current being released from the Vdata line 11 to the VGH line 14 and the VGL line 15, and there is only a very weak reverse leakage current being released to the VGH line 14 and the VGL line 15. When ESD occurs, if positive charges are accumulated on the Vdata line 11, the level of the Vdata line 11 is higher than the level of the VGH line 14, and the thin-film transistor M1 is conductive reversely to release the positive charges on the Vdata line 11 to the VGH line 14; if negative charges are accumulated on the Vdata line 11, the level of the Vdata line 11 is lower than the level of the VGL line 15, the thin-film transistor M2 is conductive reversely to release the negative charges on the Vdata line 11 to the VGL line 15 to ensure the array inside the display device from the electrostatic damage.

At present, the oxide thin-film transistor has advantageous of high mobility, good uniformity and low cost, and thus has a rapid development. However, the existing production process has determined that an oxide thin-film transistor can only be a depletion mode thin-film transistor. If the depletion mode thin-film transistor is applied to the ESD protection circuit shown in FIG. 2, it will result in that large amounts of current will be released, in a normal operation, from the Vdata line 11 to the VGH line 14 and the VGL line 15, which may cause the array inside the display device cannot operate normally and even may damage an external driving circuit.

SUMMARY

According to embodiments of the present disclosure, there are provided an ESD protection circuit and a display device including the same for implementing electrostatic discharge by using depletion mode thin-film transistors, so as to reduce the cost of the ESD protection circuit.

According to an embodiment of the present disclosure, there is provided an ESD protection circuit for releasing electrostatic charges accumulated on a signal line to a first level line or a second level line, and the ESD protection circuit comprises: a first depletion mode thin-film transistor, a second depletion mode thin-film transistor, a third depletion mode thin-film transistor and a voltage dividing unit, wherein the first thin-film transistor has a drain connected to the first level line, a gate connected to the signal line, and a source connected to a gate of the second thin-film transistor and the voltage dividing unit;

the second thin-film transistor has a drain connected to the first level line, the gate connected to the source of the first thin-film transistor, and a source connected to the signal line;

the third thin-film transistor has a drain connected to the signal line, a gate connected to a third level line, and a source connected to the second level line;

the voltage dividing unit is connected to the source of the first thin-film transistor and the second level line, and levels of the first level line, the second level line and the third level line are sequentially decreased or increased.

The voltage dividing unit comprises voltage dividing resistors or a depletion mode thin-film transistor. Preferably, when the voltage dividing unit comprises a fourth depletion mode thin-film transistor, the fourth thin-film transistor has a drain connected to the source of the first thin-film transistor, a gate connected to the second level line, and a source connected to the second level line. A width to length ratio of an effective channel region of the fourth thin-film transistor is smaller than those of the first thin-film transistor, the second thin-film transistor and the third thin-film transistor.

When the first thin-film transistor, the second thin-film transistor and the third thin-film transistor are all N-type thin-film transistors, the levels of the first level line, the second level line and the third level line are sequentially decreased.

When the first thin-film transistor, the second thin-film transistor and the third thin-film transistor are all P-type thin-film transistors, the levels of the first level line, the second level line and the third level line are sequentially increased.

According to an embodiment of the present disclosure, there is provided a display device comprising the ESD protection circuit in any of the above embodiments, wherein the ESD protection circuit includes a first depletion mode thin-film transistor, a second depletion mode thin-film transistor, a third depletion mode thin-film transistor and a voltage dividing unit, wherein the first thin-film transistor has a drain connected to a first level line, a gate connected to a signal line, a source connected to a gate of the second thin-film transistor and the voltage dividing unit;

the second thin-film transistor has a drain connected to the first level line, the gate connected to the source of the first thin-film transistor, and a source connected to the signal line;

the third thin-film transistor has a drain connected to the signal line, a gate connected to a third level line, a source connected to a second level line;

the voltage dividing unit is connected to the source of the first thin-film transistor and the second level line, and levels of the first level line, the second level line and the third level line are sequentially decreased or increased.

As known from the above technical solutions, the ESD protection circuit in the embodiments of the present disclosure is used for releasing electrostatic charges accumulated on a signal line to a first level line or a second level line, and the ESD protection circuit comprises: a first depletion mode thin-film transistor, a second depletion mode thin-film transistor, a third depletion mode thin-film transistor and a voltage dividing unit, wherein the first thin-film transistor has a drain connected to the first level line, a gate connected to the signal line, a source connected to a gate of the second thin-film transistor and the voltage dividing unit; the second thin-film transistor has a drain connected to the first level line, the gate connected to the source of the first thin-film transistor, and a source connected to the signal line; the third thin-film transistor has a drain connected to the signal line, a gate connected to a third level line, a source connected to the second level line; the voltage dividing unit is connected to the source of the first thin-film transistor and the second level line, and levels of the first level line, the second level line and the third level line are sequentially decreased or increased. The ESD protection circuit of the embodiments of the present disclosure adopts the depletion mode thin-film transistors with low cost, during a normal operation, it may be effectively avoided that large amounts of current is released from the signal line to the first level line or the second level line to ensure that the array inside the display device operates normally; when ESD occurs, the charges accumulated on the signal line can be release quickly to ensure the array inside the display device from the electrostatic damage. Therefore, the embodiments of the present disclosure are capable of achieving the implementation of electrostatic discharge by using depletion mode thin-film transistors with low cost to reduce the cost of the ESD protection circuit thereby reducing the manufacturing cost of the display device including the same.

DETAILED DESCRIPTION

According to embodiments of the present disclosure, there is provided an ESD protection circuit comprising: a first depletion mode thin-film transistor, a second depletion mode thin-film transistor, a third depletion mode thin-film transistor and a voltage dividing unit, which may implement electrostatic discharge by using depletion mode thin-film transistors with low cost, so as to reduce the cost of the ESD protection circuit.

The ESD protection circuit of embodiments of the present disclosure will be described in detail below with reference to accompanying drawings.

Figure 3:
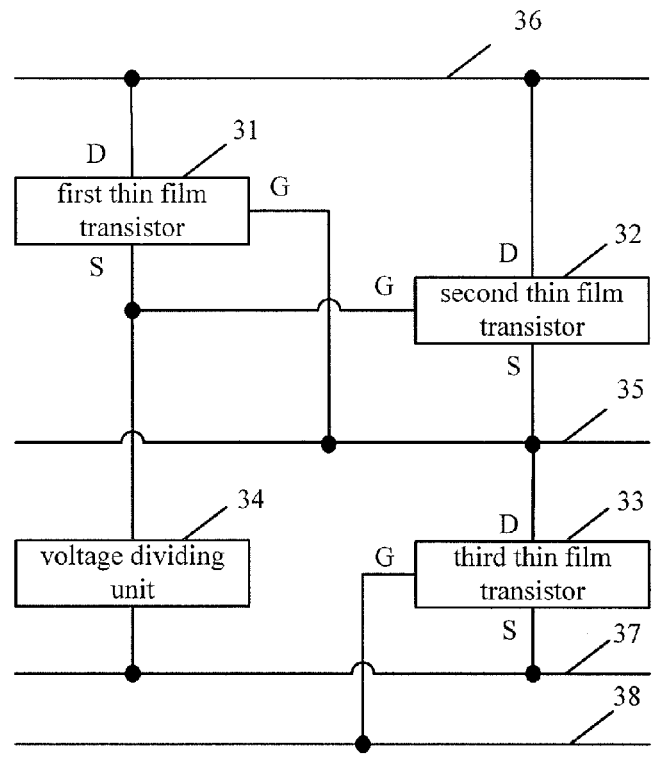
FIG. 3 is a schematic diagram of a structure of an ESD protection circuit according to a specific embodiment of the present disclosure.

FIG. 3 is a schematic diagram of a structure of an ESD protection circuit according to a specific embodiment of the present disclosure.

With reference to FIG. 3, the ESD protection circuit of the embodiments of the present disclosure is used for releasing electrostatic charges accumulated on a signal line 35 to a first level line 36 or a second level line 37, and the ESD protection circuit comprises: a first depletion mode thin-film transistor 31, a second depletion mode thin-film transistor 32, a third depletion mode thin-film transistor 33 and a voltage dividing unit 34.

The first thin-film transistor 31 has a drain connected to the first level line 36, a gate connected to the signal line 35, and a source connected to a gate of the second thin-film transistor 32 and the voltage dividing unit 34.

The second thin-film transistor 32 has a drain connected to the first level line 36, the gate connected to the source of the first thin-film transistor 31, and a source connected to the signal line 35.

The third thin-film transistor 33 has a drain connected to the signal line 35, a gate connected to a third level line 38, and a source connected to the second level line 37.

The voltage dividing unit 34 is connected to the source of the first thin-film transistor 31 and the second level line 37.

Levels of the first level line 36, the second level line 37 and the third level line 38 are sequentially decreased or increased.

Here, from the viewpoint of making a thin-film transistor, a source and a drain have a same structure and can be used interchangeably. The signal line 35 includes a data line or gate lines. The voltage dividing unit 34 comprises voltage dividing resistors or a depletion mode thin-film transistor. Preferably, when the voltage dividing unit 34 comprises a fourth depletion mode thin-film transistor, the fourth thin-film transistor has a drain connected to the source of the first thin-film transistor 31, a gate connected to the second level line 37, and a source connected to the second level line 37. A width to length ratio of an effective channel region of the fourth thin-film transistor is smaller than those of the first thin-film transistor 31, the second thin-film transistor 32 and the third thin-film transistor 33, such that a resistance of the fourth thin-film transistor is large and a current flowing through the fourth thin-film transistor is small, and thus a low power consumption is maintained without affecting the levels of the first level line 36 and the second level line 37.

When the first thin-film transistor 31, the second thin-film transistor 32 and the third thin-film transistor 33 are all N-type thin-film transistors, the levels of the first level line 36, the second level line 37 and the third level line 38 are sequentially decreased. When the first thin-film transistor 31, the second thin-film transistor 32 and the third thin-film transistor 33 are all P-type thin-film transistors, the levels of the first level line 36, the second level line 37 and the third level line 38 are sequentially increased.

Preferably, when the level of the first level line 36 is higher than the level of the second level line 37, a gate high level (VGH) line can be used as the first level line 36, and a gate low level (VGL) line can be used as the second level line 37; when the level of the first level line 36 is lower than the level of the second level line 37, the gate low level (VGL) line can be used as the first level line 36, and the gate high level (VGH) line can be used as the second level line 37. Of course, outgoing lines specifically used for ESD protection can also be added as the first level line 36, the second level line 37 and the third level line 38, so as to obtain a higher anti-interference ability inside the display device.

Figure 4:
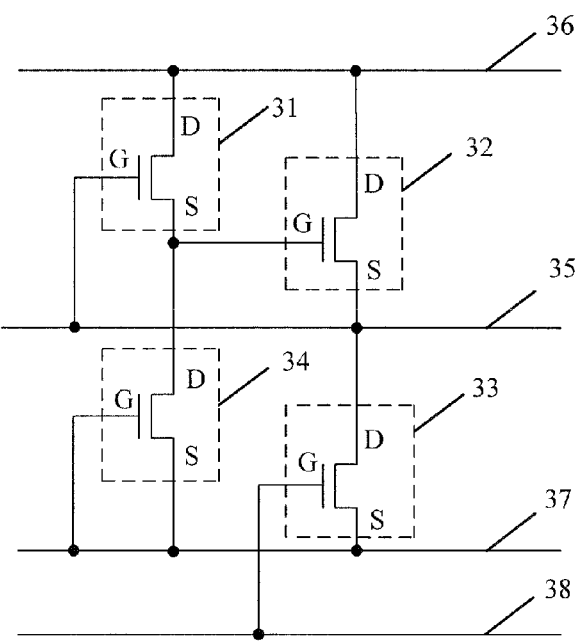
FIG. 4 is a schematic diagram of a structure of an ESD protection circuit according to another specific embodiment of the present disclosure.

In one embodiment, when the first thin-film transistor 31, the second thin-film transistor 32 and the third thin-film transistor 33 are all N-type thin-film transistors, and the voltage dividing unit 34 comprises a four depletion mode thin-film transistor which is an N-type thin-film transistor, the structure of the ESD protection circuit is as shown in FIG. 4, wherein levels of the first level line 36, the second level line 37 and the third level line 38 are sequentially decreased. In order to ensure that the third thin-film transistor 33 can be completely turned off during a normal operation of the display device, a gate potential of the third thin-film transistor 33 should be lower than a source potential of the third thin-film transistor 33, and the difference therebetween should be greater than a threshold voltage of the third thin-film transistor 33. Therefore, a difference between the levels of the second level line 37 and the third level line 38 should be greater than the threshold voltage of the third thin-film transistor 33.

During the normal operation, the level of the signal line 35 is between the level of the first level line 36 and the level of the second level line 37, the first thin-film transistor 31 is conductive slightly; the fourth thin-film transistor is conductive, and the conduction current is small; the gate potential of the second thin-film transistor 32 is obtained by the voltage division of the first thin-film transistor 31 and the fourth thin-film transistor and is lower than the source potential of the second thin-film transistor 32, and thus the second thin-film transistor 32 is not conductive or is conductive slightly, and the second thin-film transistor 32 is conductive slightly only when the level of the signal line 35 is close to the level of the first level line 36; a gate potential of the third thin-film transistor 33 is lower than a source potential of the third thin-film transistor 33, and thus the third thin-film transistor 33 is not conductive. In summary, during the normal operation, the first thin-film transistor 31 is slightly conductive, the second thin-film transistor 32 is not conductive or is slightly conductive, the third thin-film transistor 33 is not conductive, which will not affect entry of the signal on the signal line 35 into the internal pixel units; the fourth thin-film transistor is conductive, and the current is very small in order to keep the low power consumption and not affect the levels of the first level line 36 and the second level line 37.

When ESD occurs, if positive charges are accumulated on the signal line 35, the potential of the signal line 35 will rise, the conduction ability of the first thin-film transistor 31 is enhanced, the gate potential $V_1$ of the second thin-film transistor 32 rises, when $V_1$ rises to or above $V_2+V_{th1}$, wherein $V_2$ is the potential of the first level line 36, i.e., a drain potential of the second thin-film transistor 32, and $V_{th1}$ is the threshold voltage of the second thin-film transistor 32. Since the second thin-film transistor 32 is a depletion mode N-type transistor, $V_{th1}<0$ and thus the second thin-film transistor 32 is conductive reversely at this time, the positive charges accumulated on the signal line 35 are released to the first level line 36, and the release current is in proportion to $(V_1-V_2-V_{th1})^2$. If negative charges are accumulated on the signal line 35, the potential of the signal line 35 will be decreased, that is, a drain potential $V_3$ of the third thin-film transistor 33 will be decreased, when $V_3$ is decreased to or below $V_4-V_{th2}$, wherein $V_4$ is the potential of the third level line 38, i.e., a gate potential of the third thin-film transistor 33, and $V_{th2}$ is the threshold voltage of the third thin-film transistor 33. Since the third thin-film transistor 33 is a depletion mode N-type transistor, $V_{th2}<0$, and thus third thin-film transistor 33 is conductive reversely at this time, the negative charges accumulated on the signal line 35 are released to the second level line 37, and the release current is in proportion to $(V_4-V_3-V_{th2})^2$. In summary, when ESD occurs, the circuit of FIG. 4 can quickly release the positive charges or the negative charges accumulated on the signal line 35.

Figure 1:
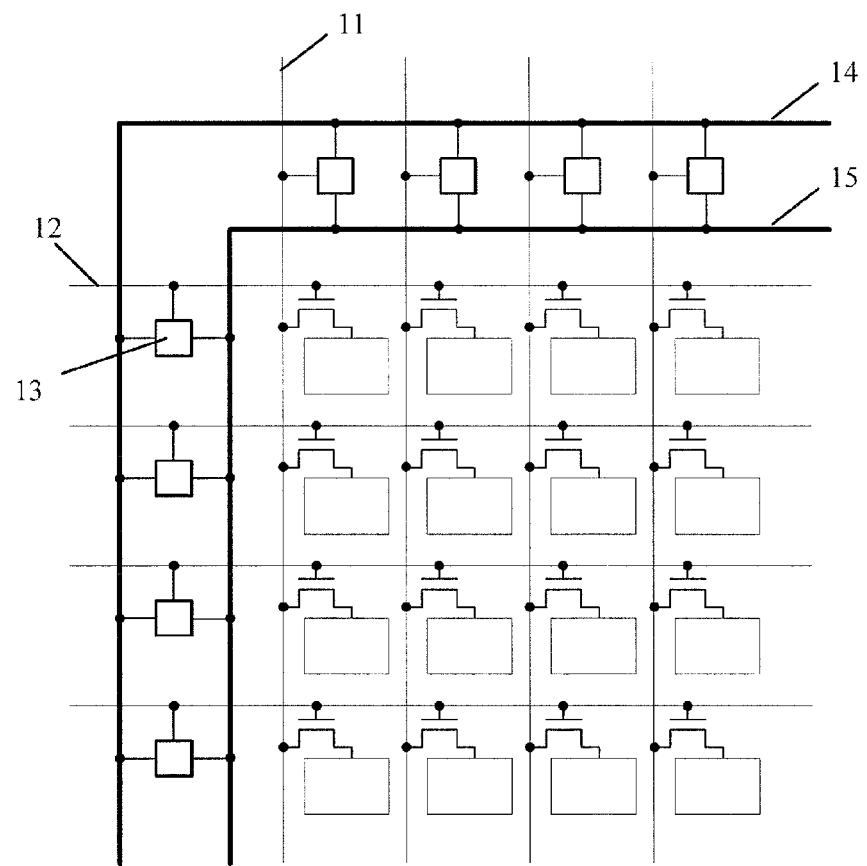
FIG. 1 is a schematic diagram of a structure of an array inside the display device and an ESD protection circuit surrounding the array in the prior art.
Figure 2:
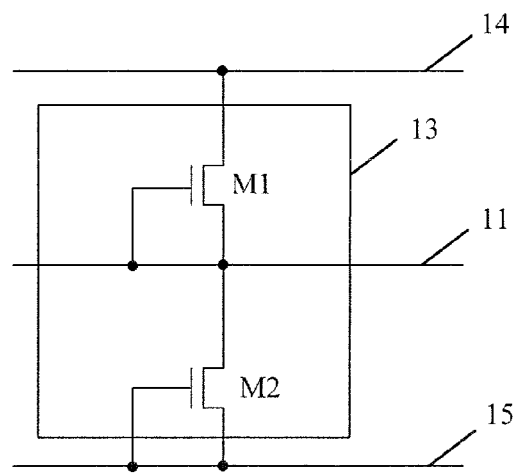
FIG. 2 is a schematic diagram of a structure of an ESD protection circuit in the prior art.
Figure 5:
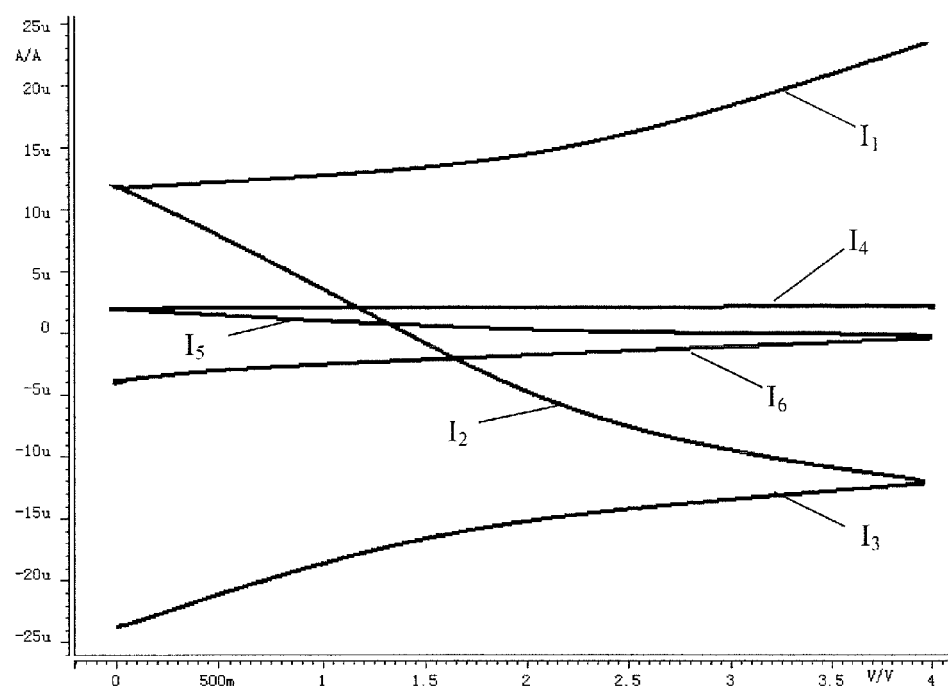
FIG. 5 is a comparison diagram of leakage currents of ESD protection circuits shown in FIG. 4 and FIG. 2 during a normal operation.

It will be described below the leakage current situation when the depletion mode thin-film transistors are applied to the ESD protection circuit shown in FIG. 2, which operate normally as compared with the ESD protection circuit shown in FIG. 4 by taking as an example that the first level line is the VGH line, the second level line is the VGL line and the signal line is the Vdata line. In the comparison, except for the structure, other conditions of the two circuits are the same, particularly, the two circuits both adopt the depletion mode N-type thin-film transistors having a threshold voltage of −2V and a width to length ratio of 20 um/4 um, the VGH line having a voltage of 7V, the VGL line having a voltage of −3V, the third level line having a voltage of −5.1V, and the Vdata line having a voltage scanning from 0V to 4V. The leakage currents generated in the two circuits are shown in FIG. 5. Currents on the VGH line, the Vdata line and the VGL line in the protection circuit of FIG. 2 are represented as $I_1$, $I_2$ and $I_3$, respectively, and a forward leakage current larger than 20 uA would be generated during the normal operation of the protection circuit of FIG. 2; on the other hand, currents on the VGH line, the Vdata line and the VGL line in the protection circuit of FIG. 4 are represented as $I_4$, $I_5$ and $I_6$, respectively, and a leakage current lower than 5 uA would be generated merely during the normal operation of the protection circuit of FIG. 4. Therefore, the ESD protection circuit shown in FIG. 4 is suitable for the depletion mode thin-film transistors with low cost, and the manufacturing cost of the ESD protection circuit is reduced.

Figure 6:
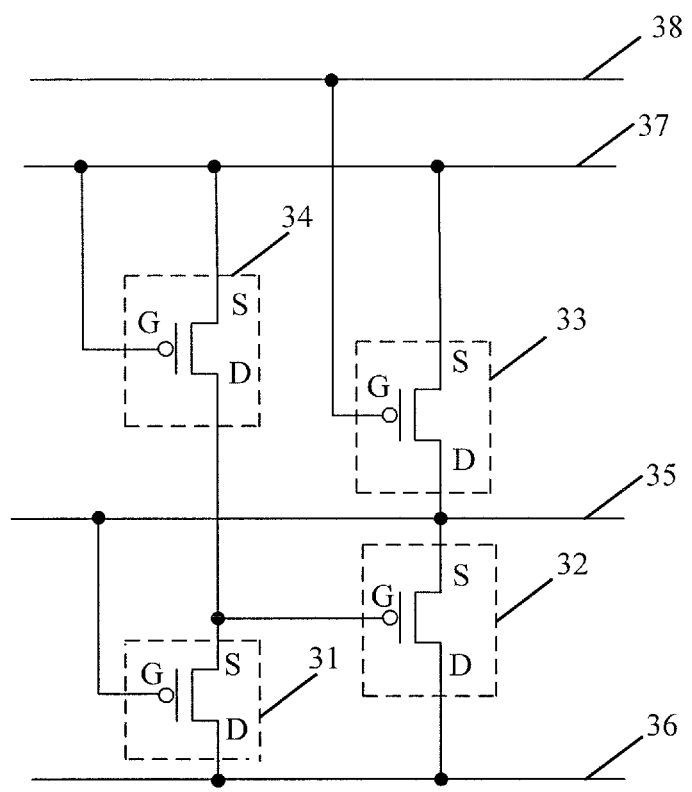
FIG. 6 is a schematic diagram of a structure of an ESD protection circuit according to still another specific embodiment of the present disclosure.

In another embodiment, when the first thin-film transistor 31, the second thin-film transistor 32 and the third thin-film transistor 33 are all P-type thin-film transistors, and the voltage dividing unit 34 comprises a fourth depletion mode thin-film transistor which is an P-type thin-film transistor, the structure of the ESD protection circuit is as shown in FIG. 6, wherein levels of the first level line 36, the second level line 37 and the third level line 38 are sequentially increased. In order to ensure that the third thin-film transistor 33 can be completely turned off during a normal operation of the display device, a gate potential of the third thin-film transistor 33 should be higher than a source potential of the third thin-film transistor 33, and a difference therebetween should be greater than a threshold voltage of the third thin-film transistor 33, and therefore a difference between the levels of the third level line 38 and the second level line 37 should be greater than the threshold voltage of the third thin-film transistor 33.

During the normal operation, the level of the signal line 35 is between the level of the first level line 36 and the level of the second level line 37, the first thin-film transistor 31 is conductive slightly; the fourth thin-film transistor is conductive, and the conduction current is small; the gate potential of the second thin-film transistor 32 is obtained by the voltage division of the first thin-film transistor 31 and the fourth thin-film transistor and is higher than the source potential of the second thin-film transistor 32, and thus the second thin-film transistor 32 is not conductive or is conductive slightly, and the second thin-film transistor 32 is conductive slightly only when the level of the signal line 35 is close to the level of the first level line 36; a gate potential of the third thin-film transistor 33 is higher than a source potential of the third thin-film transistor 33, and thus the third thin-film transistor 33 is not conductive. In summary, during the normal operation, the first thin-film transistor 31 is slightly conductive, the second thin-film transistor 32 is not conductive or is slightly conductive, the third thin-film transistor 33 is not conductive, which will not affect entry of the signal on the signal line 35 into the internal pixel units; the fourth thin-film transistor is conductive, and the current is very small in order to keep the low power consumption and not affect the levels of the first level line 36 and the second level line 37.

When ESD occurs, if negative charges are accumulated on the signal line 35, the potential of the signal line 35 will be decreased thereby the conduction ability of the first thin-film transistor 31 is enhanced and the gate potential $V_5$ of the second thin-film transistor 32 will be decreased. When $V_5$ is decreased to or below $V_6+V_{th3}$, wherein $V_6$ is the potential of the first level line 36, i.e., a drain potential of the second thin-film transistor 32, and $V_{th3}$ is the threshold voltage of the second thin-film transistor 32. Since the second thin-film transistor 32 is a depletion mode P-type transistor, $V_{th3}>0$, and thus the second thin-film transistor 32 is conductive reversely at this time, the negative charges accumulated on the signal line 35 are released to the first level line 36, and the release current is in proportion to $(V_5-V_6-V_{th3})^2$. If positive charges are accumulated on the signal line 35, the potential of the signal line 35 rises, that is, a drain potential $V_7$ of the third thin-film transistor 33 rises, when $V_7$ rises to or above $V_8-V_{th4}$, wherein $V_8$ is the potential of the third level line 38, i.e., a gate potential of the third thin-film transistor 33, and $V_{th4}$ is the threshold voltage of the third thin-film transistor 33. Since the third thin-film transistor 33 is a depletion mode P-type transistor, $V_{th4}>0$, and thus the third thin-film transistor 33 is conductive reversely at this time, the positive charges accumulated on the signal line 35 are released to the second level line 37, and the release current is in proportion to $(V_8-V_7-V_{th4})^2$. In summary, when ESD occurs, the positive and negative charges accumulated on the signal line 35 can be released quickly by using the circuit of FIG. 6.

A display device in accordance with an embodiment of the present disclosure comprises the ESD protection circuit as shown in FIG. 3, FIG. 4 or FIG. 6. The ESD protection circuit in the display device is used for quickly releasing the positive and negative charges accumulated on a Vdata line or a Vgate line to ensure the array inside the display device from the electrostatic damage thereby reducing the manufacturing cost of the display device.

As known from the above technical solutions, the ESD protection circuit in the embodiments of the present disclosure is used for releasing electrostatic charges accumulated on a signal line to a first level line or a second level line, and the ESD protection circuit comprises: a first depletion mode thin-film transistor, a second depletion mode thin-film transistor, a third depletion mode thin-film transistor and a voltage dividing unit, wherein the first thin-film transistor has a drain connected to the first level line, a gate connected to the signal line, a source connected to a gate of the second thin-film transistor and the voltage dividing unit; the second thin-film transistor has a drain connected to the first level line, the gate connected to the source of the first thin-film transistor, and a source connected to the signal line; the third thin-film transistor has a drain connected to the signal line, a gate connected to a third level line, a source connected to the second level line; the voltage dividing unit is connected to the source of the first thin-film transistor and the second level line, and levels of the first level line, the second level line and the third level line are sequentially decreased or increased. The ESD protection circuit of the embodiments of the present disclosure adopts the depletion mode thin-film transistors with low cost, during a normal operation, it may be effectively avoided that large amounts of current is released from the signal line to the first level line or the second level line to ensure that the array inside the display device operates normally; when an ESD occurs, the charges accumulated on the signal line can be released quickly to ensure the array inside the display device from the electrostatic damage. Therefore, the embodiments of the present disclosure are capable of achieving the implementation of electrostatic discharge by using depletion mode thin-film transistors with low cost to reduce the cost of the ESD protection circuit thereby reducing the manufacturing cost of the display device including the same.

It is apparent that those skilled in the art may make modifications and variations to the above embodiments without departing from the spirit and scope of the present disclosure as defined by claims of the application and equivalent techniques. Such variations and modifications are intended to be included within the spirit and scope of the present disclosure.

What is claimed is:

1. An electrostatic discharge protection circuit comprising: a first depletion mode thin-film transistor, a second depletion mode thin-film transistor, a third depletion mode thin-film transistor and a voltage dividing unit, wherein
    the first thin-film transistor has a drain connected to a first level line without intervention of any transistor, a gate connected to a signal line, and a source connected to a gate of the second thin-film transistor and the voltage dividing unit without intervention of any transistor;
    the second thin-film transistor has a drain connected to the first level line, the gate connected to the source of the first thin-film transistor, and a source connected to the signal line;
    the third thin-film transistor has a drain connected to the signal line, a source connected to a second level line, and a gate connected to a third level line; and
    the voltage dividing unit is connected to the source of the first thin-film transistor and the second level line without intervention of any transistor,
    wherein the signal line, the first level line, the second level line, and the third level line are different from each other, the third level line is not connected to the voltage dividing unit, and electrostatic charges on the signal line are discharged to the first level line or the second level line according to a polarity of the electrostatic charges on the signal line.

2. The protection circuit of claim 1, wherein the voltage dividing unit comprises voltage dividing resistors or a depletion mode thin-film transistor.

3. The protection circuit of claim 2, wherein when the voltage dividing unit comprises a fourth depletion mode thin-film transistor, the fourth thin-film transistor has a drain connected to the source of the first thin-film transistor, a gate connected to the second level line, and a source connected to the second level line.

4. The protection circuit of claim 3, wherein a width to length ratio of an effective channel region of the fourth thin-film transistor is smaller than those of the first thin-film transistor, the second thin-film transistor and the third thin-film transistor.

5. The protection circuit of claim 1, wherein when the first thin-film transistor, the second thin-film transistor and the third thin-film transistor are all N-type thin-film transistors, levels of the first level line, the second level line and the third level line are sequentially decreased.

6. The protection circuit of claim 1, wherein when the first thin-film transistor, the second thin-film transistor and the third thin-film transistor are all P-type thin-film transistors, levels of the first level line, the second level line and the third level line are sequentially increased.

7. The protection circuit of claim 1, wherein the signal line includes data lines or gate lines.

8. The protection circuit of claim 2, wherein the signal line includes data lines or gate lines.

9. The protection circuit of claim 3, wherein the signal line includes data lines or gate lines.

10. The protection circuit of claim 4, wherein the signal line includes data lines or gate lines.

11. The protection circuit of claim 5, wherein the signal line includes data lines or gate lines.

12. The protection circuit of claim 6, wherein the signal line includes data lines or gate lines.

13. A display device comprising an electrostatic discharge protection circuit, the protection circuit including a first depletion mode thin-film transistor, a second depletion mode thin-film transistor, a third depletion mode thin-film transistor and a voltage dividing unit, wherein the first thin-film transistor has a drain connected to a first level line without intervention of any transistor, a gate connected to a signal line, and a source connected to a gate of the second thin-film transistor and the voltage dividing unit without intervention of any transistor;

the second thin-film transistor has a drain connected to the first level line, the gate connected to the source of the first thin-film transistor, and a source connected to the signal line;

the third thin-film transistor has a drain connected to the signal line, a source connected to a second level line, and a gate connected to a third level line; and the voltage dividing unit is connected to the source of the first thin-film transistor and the second level line without intervention of any transistor, wherein the signal line, the first level line, the second level line, and the third level line are different from each other, the third level line is not connected to the voltage dividing unit, and electrostatic charges on the signal line are discharged to the first level line or the second level line according to a polarity of the electrostatic charges on the signal line.

14. The display device of claim 13, wherein when the first thin-film transistor, the second thin-film transistor and the third thin-film transistor are all N-type thin-film transistors, levels of the first level line, the second level line and the third level line are sequentially decreased.

15. The display device of claim 13, wherein when the first thin-film transistor, the second thin-film transistor and the third thin-film transistor are all P-type thin-film transistors, levels of the first level line, the second level line and the third level line are sequentially increased.

* * * * *